(12) United States Patent
Gilliam

(10) Patent No.: US 6,833,281 B2
(45) Date of Patent: Dec. 21, 2004

(54) ON-CHIP SUBSTRATE REGULATOR TEST MODE

(75) Inventor: Gary Gilliam, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/935,086

(22) Filed: Aug. 22, 2001

(65) Prior Publication Data

US 2001/0052790 A1 Dec. 20, 2001

Related U.S. Application Data

(62) Division of application No. 09/065,139, filed on Apr. 23, 1998, now Pat. No. 6,304,094, which is a division of application No. 08/520,818, filed on Aug. 30, 1995, now Pat. No. 5,880,593.

(51) Int. Cl.[7] .................... H01L 21/00; G01R 31/28; H03K 3/354
(52) U.S. Cl. ................ 438/19; 324/765; 327/535
(58) Field of Search .................. 438/19; 324/765; 365/201; 327/530–537; 257/299, 901

(56) References Cited

U.S. PATENT DOCUMENTS

| | | | | |
|---|---|---|---|---|
| 4,288,865 A | | 9/1981 | Graham ..................... 365/229 |
| 4,322,675 A | | 3/1982 | Lee et al. ................... 323/277 |
| 4,553,047 A | | 11/1985 | Dillinger et al. ........... 307/297 |
| 4,577,211 A | * | 3/1986 | Bynum et al. .............. 257/546 |
| 4,585,955 A | * | 4/1986 | Uchida ....................... 327/541 |
| 4,631,421 A | | 12/1986 | Inoue et al. ................ 307/297 |
| 4,890,011 A | | 12/1989 | Miyatake ................. 307/296.2 |
| 4,964,082 A | | 10/1990 | Sato et al. ............. 365/189.09 |
| 5,079,744 A | | 1/1992 | Tobita et al. ............... 365/201 |
| 5,083,045 A | * | 1/1992 | Yim et al. ..................... 327/51 |
| 5,140,554 A | | 8/1992 | Schreck et al. ............. 365/201 |
| 5,202,587 A | * | 4/1993 | McLaury ...................... 327/50 |
| 5,210,503 A | * | 5/1993 | Sawamura ................... 327/330 |
| 5,497,119 A | * | 3/1996 | Tedrow et al. .............. 327/540 |
| 5,929,651 A | | 7/1999 | Leas et al. .................. 324/765 |

* cited by examiner

*Primary Examiner*—Ernest Karlsen
(74) *Attorney, Agent, or Firm*—Schwegman, Lundberg, Woessner & Kluth, P.A.

(57) ABSTRACT

An on-chip circuit for defect testing with the ability to maintain a substrate voltage at a level more positive or more negative than a normal negative operating voltage level of the substrate. This is accomplished with a chain of MOSFETs that are configured to operate as a chain of resistive elements or diodes wherein each element in the chain may drop a portion of a supply voltage coupled to a first end the chain. The substrate is coupled to a second end of the chain. The substrate voltage level is essentially equivalent to the supply voltage level less the voltage drops across the elements in the diode chain. A charge pump maintains the substrate voltage level set by the chain. Performing chip testing with the substrate voltage level more negative than the normal negative voltage level facilitates detection of devices that will tend to fail only at cold temperatures. Performing chip testing with the substrate voltage level more positive than the normal negative voltage level facilitates detection of other margin failures and ion contamination.

27 Claims, 3 Drawing Sheets

$$V_{GS} = 1 - V_S$$
$$V_{DS} = -1.0 - V_S$$
$$V_{GS} - V_{DS} = 2$$
$$V_{GS} = V_{DS} + 2$$

ON-CHIP SUBSTRATE REGULATOR TEST MODE

CROSS REFERENCE TO RELATED APPLICATIONS(S)

This application is a division of U.S. application Ser. No. 09/065,139, filed on Apr. 23, 1998, now U.S. Pat. No. 6,304,094, which is a division of U.S. application Ser. No. 08/520,818, filed on Aug. 30, 1995, now issued as U.S. Pat. No. 5,880,593, the specifications of which are hereby incorporated by reference.

FIELD OF THE INVENTION

This invention relates to on-chip testing circuits. More specifically, this invention relates to on-chip substrate voltage regulators for use during defect testing.

BACKGROUND OF THE INVENTION

During testing for margin defects in packaged semiconductor integrated circuit chips, it is desirable to vary the voltage level of the substrate from its normal negative operating level. One method is to set the substrate voltage level to ground. However, setting the substrate voltage level to ground during testing of some types of chips, such as 16-megabyte memory chips, may be an unrealistic testing condition because some chips that fail the testing process would operate satisfactorily with a negatively biased substrate. What is needed is an on-chip substrate regulator with the ability to vary the substrate voltage level during testing to be more positive or more negative than its normal negative operating level while maintaining the substrate voltage level below ground.

SUMMARY OF THE INVENTION

An on-chip circuit provides the ability to maintain a substrate voltage at a level more positive or more negative than a normal negative operating voltage level of the substrate. This is accomplished with a chain of MOSFETs that are coupled to operate as a chain of resistive elements or diodes wherein each element in the chain may drop a portion of a supply voltage coupled to a first end the chain. The chain is nominatively referred to as a diode chain. The substrate is coupled to a second end of the diode chain. The substrate voltage level is equivalent to the supply voltage level less the voltage drops across the elements in the diode chain. A charge pump maintains the substrate at the voltage level set by the diode chain.

A first plurality of MOSFETs in the diode chain are configured to be normally shorted. When these MOSFETs are controlled to change from a shorted condition to a condition of operating as diodes or resistive elements, the substrate level becomes more negative due to the added voltage drop. A second plurality of MOSFETs in the diode chain are configured to operate normally as diodes or resistive elements. When these MOSFETs are controlled to change from operating as diodes or resistive elements to a shorted condition, the substrate level becomes more positive due to the removed voltage drop. A third plurality of MOSFETs are coupled as switches to control whether the MOSFETs in the first and second pluralities of MOSFETs are shorted or are operating as diodes when it is desired to vary the substrate voltage level during testing.

Performing chip testing with the substrate voltage level more negative than the normal negative voltage level facilitates detection of devices that will tend to fail only at cold temperatures. Performing chip testing with the substrate voltage level more positive than the normal negative voltage level facilitates detection of other margin failures and ion contamination.

DETAILED DESCRIPTION OF THE PREFERRED EMBODIMENT

Figure 1:
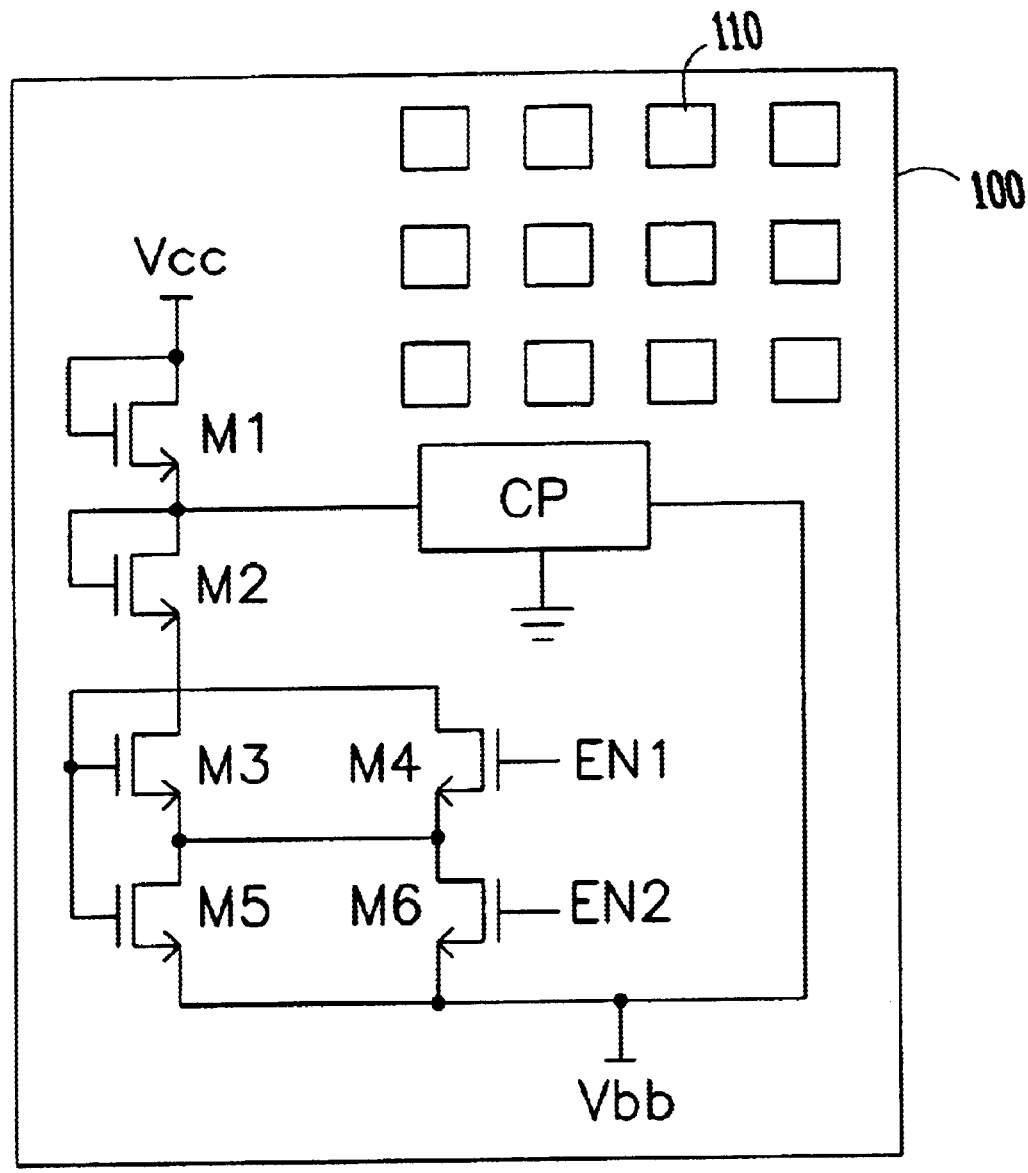
FIG. 1 shows a circuit diagram of the present invention having two control lines.

In one embodiment of FIG. 1, a memory device 100 is shown having a number of memory cells 110. The invention is, however not limited to embodiments that include a memory device. Referring to FIG. 1, Vcc is a supply voltage level. An n-channel MOSFET M1, has its gate coupled its drain. The drain of M1 and the gate of M1 are coupled to the supply voltage level Vcc. An n-channel MOSFET M2, has its gate coupled to its drain. The gate and drain of M2 are coupled to the source of M1. An n-channel MOSFET M3, has its gate coupled to its drain. The gate of M3 and the drain of M3 are coupled to the source of M2. An n-channel MOSFET M41 has its drain coupled to the drain of M3. The source of M4 is coupled to the source of M3. The gate of M4 is coupled to be controlled by a control voltage level EN1. An n-channel MOSFET M5, has its gate coupled to the gate of M3. The drain of M5 is coupled to the source of M3. The source of M5 is coupled to a substrate node Vbb. An n-channel MOSFET M6, has its drain coupled to the drain of M5. The source of M6 is coupled to the source of M5 and to the substrate node Vbb. The gate of M6 is coupled to be controlled by a control voltage level EN2. The substrate node Vbb, is coupled to the substrate of a integrated circuit chip on which the substrate voltage regulator circuit is contained.

The MOSFETs M1, M2, M3, M5 are coupled in a chain to operate as resistive elements having a non-linear resistance. As is well known, these elements can also be considered to be diodes. Each element in the chain may cause a voltage drop across the terminals of that element. Such a chain is referred to hereinafter as a diode chain. If appropriately configured, a portion of the supply voltage level Vcc, will be dropped across the drain and source of each of the MOSFETs M1, M2, M3, M5. The MOSFET M4, acts as a switch to insert the voltage drop across the drain and source of the MOSFET M3 into the diode chain or to remove the voltage drop across the drain and source of MOSFET M3 from the diode chain depending upon the control voltage level EN1. When the voltage EN1 is at a logical high, the MOSFET M4 is turned on and M3 is essentially shorted out of the diode chain. Only the saturation voltage for the MOSFET M4 will appear across the terminals of the MOSFET M3. When the voltage EN1 is at a logical low, the MOSFET M4 is turned off and MOSFET M3 is in the diode chain. In this mode, the voltage drop across the MOSFET M3 will add to the voltage drop in the chain.

The MOSFET M6, similarly acts as a switch to insert the voltage drop across the drain and source of MOSFET M5 into the diode chain or to remove the voltage drop across the drain and source of MOSFET M5 from the diode chain depending upon the control voltage level EN2. When EN2 is at a logical high, the MOSFET M6 is turned on and the MOSFET M5 is essentially shorted out of the diode chain. When EN2 is at a logical low, the MOSFET M6 is turned off and the voltage drop across the MOSFET M5 is included in the diode chain.

A charge pump circuit CP, has its input coupled to the source of the MOSFET M1, to the gate of the MOSFET M2, and to the drain of the MOSFET M2. The output of the charge pump CP is coupled to the substrate node Vbb. The charge pump CP maintains the voltage level of the substrate at the level set by the diode chain. The substrate voltage level is substantially equivalent to the supply voltage Vcc, less any voltage drops across the drain and source of each of the MOSFETs M1, M2, M3 and M5 which are not shorted out of the chain.

Under normal operating conditions, when the integrated circuit chip is not being tested, the substrate is usually maintained at a negative level. Depending on the requirements of the particular integrated circuit chip, the substrate level is typically in the range of 1.5 to 2.0 volts below ground level, but may be higher or lower. The substrate voltage level for normal operating conditions is determined by the presence of voltage drops across the drain and source of MOSFETs in the diode chain. In order to have the ability to set the substrate voltage to a level either more positive or more negative than the normal negative voltage level of the substrate, it is desirable to have the ability to add voltage drops into the diode chain or to remove voltage drops from the diode chain.

For example, in FIG. 1, the non-test condition of EN1 may be at a logical low so that the MOSFET M3 is in the diode chain because the MOSFET M4 is off. The non-test condition of EN2 may be at a logical high so that the MOSFET M5 is essentially shorted out of the diode chain because the MOSFET M6 is on. Therefore, the voltage level of the substrate at node Vbb, under non-test conditions, is substantially equivalent to the supply voltage level Vcc, less the voltage dropped by the three MOSFETs M1, M2 and M3. Under test conditions, the voltage level at node Vbb can be made more positive by raising the control signal EN1 to a logical high. Such an enabling of the control signal EN1 turns on the MOSFET M4 which essentially shorts the channel of the MOSFET M3 thereby removing the MOSFET M3 from the diode chain, so that the voltage level at Vbb is substantially equivalent to the supply voltage level Vcc, less the voltage dropped by only the MOSFETs M1 and M2. The normal substrate voltage level at Vbb can then be restored by returning the control voltage EN1 to a logical low.

As another test condition, the substrate voltage level Vbb, can be made more positive than its normal negative voltage level by lowering the control voltage EN2 to a logical low. Such a disabling of the control signal EN2 cuts off the MOSFET M6 and includes the MOSFET M5 in the diode chain. Under these conditions, Vbb is substantially equivalent to the supply voltage level Vcc, less the voltage dropped by the MOSFETs M1, M2, M3 and M5.

There may be test conditions where it is desired to only be able to change the voltage level at Vbb to make Vbb more positive. Under such conditions, the control signals EN1 and EN2 can both have a non-test condition of a logical low. Then the substrate voltage level Vbb, can be made more positive by raising either the control signal EN1 or the control signal EN2. To make Vbb even more positive, both the control signals EN1 and EN2 can both raised to a logical high.

Conversely, if it is desired to only be able to change the voltage level at Vbb to make Vbb more negative during a testing operation, both the control signals EN1 and EN2 can have a non-test condition of a logical high. Then the substrate voltage level Vbb, can be made more negative by lowering either the control signal EN1 or the control signal EN2. To make Vbb even more negative, both the control signal EN1 and the control signal EN2 can be configured to a logical low.

Figure 2:
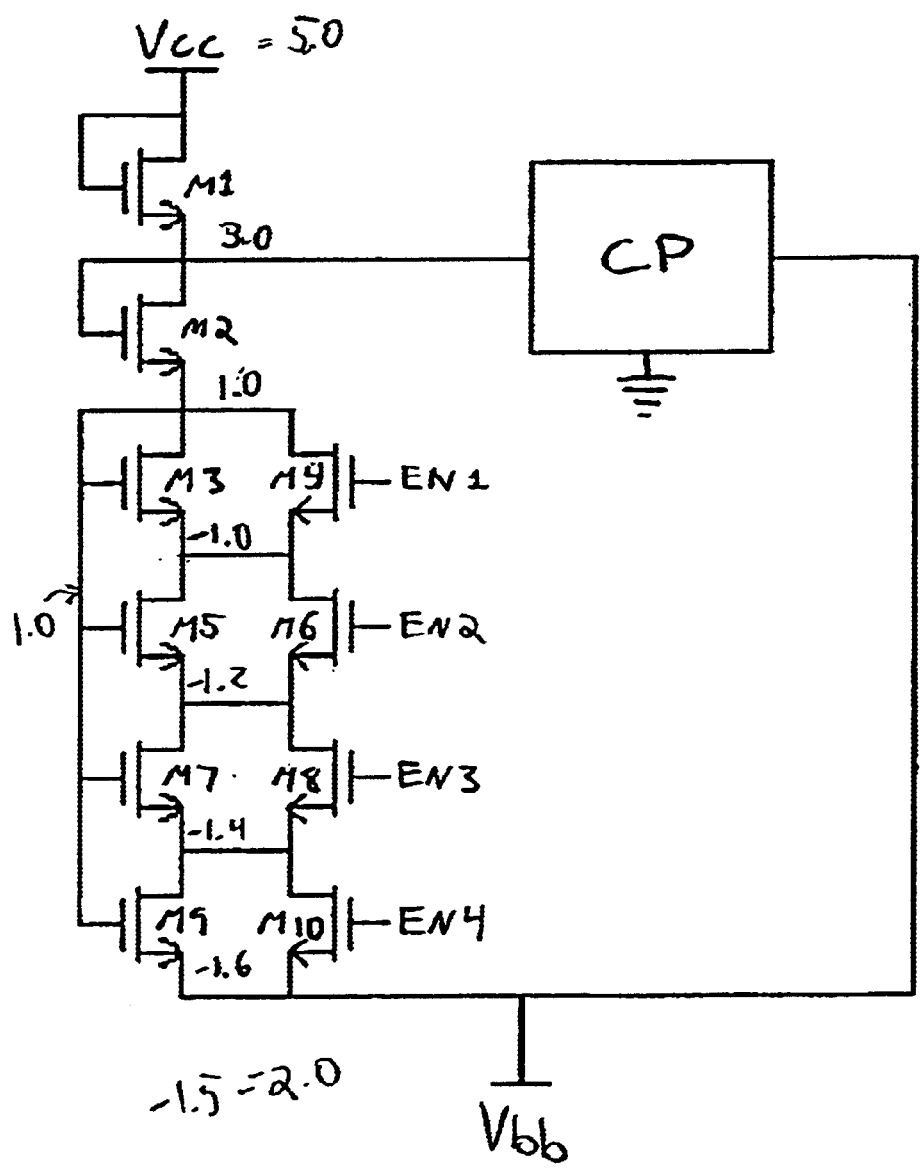
FIG. 2 shows a circuit diagram of the present invention having four control lines.

FIG. 2 shows the invention as shown in FIG. 1 except as noted below. The diode chain of FIG. 2 has two additional n-channel MOSFETs M7 and M9 in the diode chain and two additional n-channel MOSFETs M8 and M10 operating as switches. Rather than being coupled to the substrate node Vbb, as in FIG. 1, the source of the MOSFET M5 is coupled to the drain of the MOSFET M7 in FIG. 2. Rather than being coupled to the substrate node Vbb, as in FIG. 1, the source of the MOSFET M6 is coupled to the drain of M8 in FIG. 2. The drain of the MOSFET M7 is coupled to the drain of the MOSFET M8. The gate of the MOSFET M8 is coupled to be controlled by a control voltage level EN3. The source of the MOSFET M8 is coupled to the drain of the MOSFET M10. The source of the MOSFET M10 is coupled to the substrate node Vbb. The gate of the MOSFET M10 is coupled to be controlled by a control voltage level EN4. The source of the MOSFET M7 is coupled to the drain of the MOSFET M9. The drain of the MOSFET M9 is coupled to the drain of the MOSFET M10. The source of the MOSFET M9 is coupled to the substrate node Vbb. The gate of the MOSFET M7 and the gate of the MOSFET M9 are coupled to the gate of the MOSFET M5 and to the gate of the MOSFET M3. The MOSFET M8, operates as a switch to add the voltage drop across the drain and the source of the MOSFET M7 to the diode chain or to remove the voltage drop across the drain and the source of the MOSFET M7 from the diode chain. The MOSFET M10, operates as a switch to add the voltage drop across the drain and the source of the MOSFET M9 to the diode chain or to remove the voltage drop across the drain and the source of the MOSFET M9 from the diode chain.

The addition of the MOSFETs M7, MB, M9 and M10 to the circuit increases the adjustability of the substrate voltage level Vbb, beyond that of the circuit shown in FIG. 1. For example, the non-test condition for the control signals EN1 and EN2 may be a logical low so that the MOSFETs M3 and M5 are in the diode chain. The non-test condition for the control signals EN3 and EN4 may be a logical high so that the MOSFETs M7 and M8 are essentially shorted out of the diode chain. Under test conditions, the substrate voltage level Vbb may be made more positive by raising the control signal EN1 to a logical high and essentially shorting the MOSFET M3 out of the diode chain. The substrate voltage level Vbb can then be made even more positive by raising the control signal EN2 to a logical high and essentially shorting the MOSFET M5 out of the diode chain, as well. The normal substrate voltage level at Vbb can then be restored by returning the control signals EN1 And EN2 to a logical low. The substrate voltage level Vbb, can be made more negative from its non-test condition by lowering the control signal EN3 to a logical low and thereby adding the MOSFET M7 to the diode chain. The substrate voltage level Vbb, can then be made even more negative by lowering the control signal EN4 to a logical low and adding the MOSFET M9 to the diode chain.

Alternatively, the normal, non-test substrate voltage level at Vbb can be set by raising or lowering the control voltage levels EN1, EN2, EN3 and EN4 in any combination. Then, under test conditions, the substrate voltage level Vbb, can be adjusted by controlling the control signals EN1, EN2, EN3 and EN4. For example, the control signals EN1 and EN2 can be coupled together and the control signals EN3 and EN4 can be coupled together. The non-test substrate voltage level Vbb, may be set by raising the control signal pair of EN1 and EN2 to a logical high and by lowering the control signal pair EN3 and EN4 to a logical low. Then, under test conditions, the substrate voltage level Vbb, can be made more positive by raising the control signal pair EN3 and EN4 to a logical high or the substrate voltage level Vbb can be made more negative by lowering the control signal pair EN1 and EN2 to a logical low.

Figure 3:
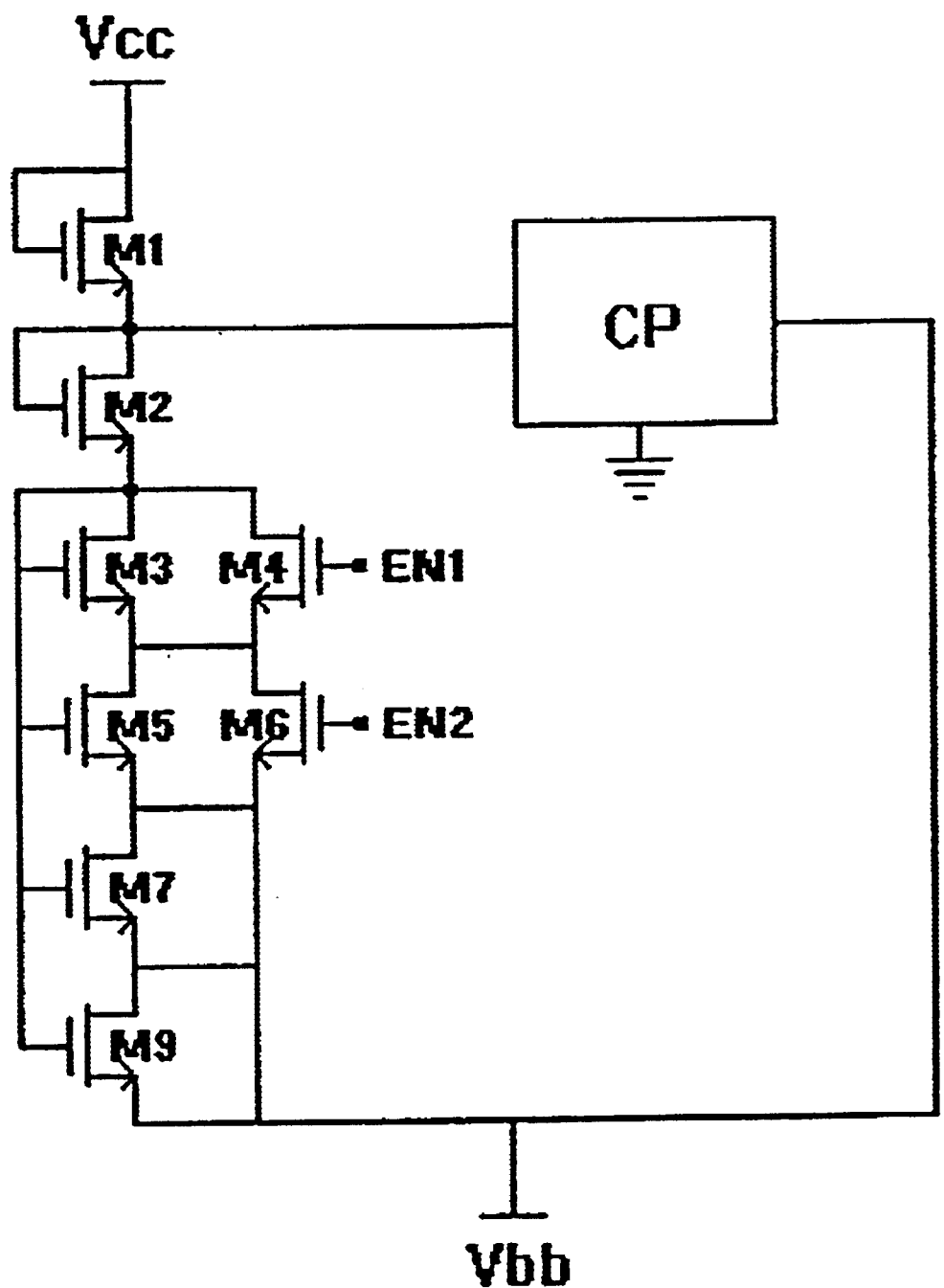
FIG. 3 shows a circuit diagram of the present invention having two unused MOSFETs.

FIG. 3 shows another embodiment of the present invention wherein two n-channel MOSFETs M7, M9 are hard wired to be shorted out of the diode chain. The circuit in FIG. 3 has the same structure as the circuit in FIG. 2, except as noted below. The drain of the MOSFET M7, the source of the MOSFET M7, the drain of MOSFET M9, the source of the MOSFET M9, the source of the MOSFET M5 and the source of the MOSFET M6 are coupled to the node Vbb. The gate of the MOSFET M7 is coupled to the gate of the MOSFET M9 and to the gate of the MOSFET M3 and to the gate of the MOSFET M5. The MOSFETs M8 and M10 are absent. This circuit configuration operates as the circuit shown in FIG. 1, but can be conveniently modified to operate as the circuit shown in FIG. 2 by adding the MOSFETs M8 and M10 as shown in FIG. 2.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, it will be apparent to one of ordinary skill in the art that the method of the present invention could be implemented in many different ways and the apparatus disclosed above is only illustrative of the preferred embodiment of the present invention. For example, a diode chain could be constructed having any number of MOSFETs as non-linear resistors and any number of MOSFETs as switches, other devices such as resistors or diodes may be used to drop voltages in the diode chain, or p-channel MOSFETs may be used in the circuit as diodes or switches, or the charge pump may be coupled to a different junction of elements in the diode chain.

What is claimed is:

1. A method of forming an integrated circuit, comprising:
    forming an array of memory cells on a substrate;
    coupling a substrate voltage level controller circuit to the substrate for setting a substrate voltage bias level including:
    coupling a series of diodes between a supply voltage source and the substrate; and
    coupling at least one bypass transistor to at least one diode in the series of diodes for electrically bypassing at least one diode, wherein the at least one bypass transistor is adapted for selective actuation to both an on state and an off state by a user while setting a substrate voltage bias level.

2. The method of claim 1 wherein coupling at least one bypass transistor to at least one diode includes coupling a plurality of bypass transistors to a plurality of diodes in the series of diodes for electrically bypassing the plurality of diodes.

3. The method of claim 1 wherein coupling at least one bypass transistor to at least one diode includes coupling at least one bypass transistor to plurality of diodes for electrically bypassing the plurality of diodes.

4. The method of claim 1 wherein coupling at least one bypass transistor to at least one diode includes coupling at least one normally off bypass transistor to at least one diode leaving the at least one diode unbypassed during normal operation and allowing the at least one diode to be selectively bypassed during testing operations.

5. The method of claim 1 wherein coupling at least one bypass transistor to at least one diode includes coupling at least one normally on bypass transistor to at least one diode leaving the at least one diode bypassed during normal operation and allowing the at least one diode to be selectively unbypassed during testing operations.

6. A method of forming an integrated circuit, comprising:
    forming an array of memory cells on a substrate;
    coupling a substrate voltage level controller circuit to the substrate for setting a substrate voltage bias level including:
    coupling a series of diodes between a supply voltage source and the substrate; and
    coupling at least one bypass transistor to a plurality of diodes in the series of diodes for electrically bypassing the plurality of diodes, wherein the at least one bypass transistor is adapted for selective actuation to both an on state and an off state by a user while setting a substrate voltage bias level.

7. The method of claim 6 wherein coupling at least one bypass transistor to a plurality of diodes includes coupling at least one normally off bypass transistor to a plurality of diodes leaving the plurality of diodes unbypassed during normal operation and allowing the plurality of diodes to be selectively bypassed during testing operations.

8. The method of claim 6 wherein coupling at least one bypass transistor to a plurality of diodes includes coupling at least one normally on bypass transistor to a plurality of diodes leaving the plurality of diodes bypassed during normal operation and allowing the plurality of diodes to be selectively unbypassed during testing operations.

9. A method of forming an integrated circuit, comprising:
    forming an array of memory cells on a substrate;
    coupling a substrate voltage level controller circuit to the substrate for setting a substrate voltage bias level including:
    coupling a series of diodes between a supply voltage source and the substrate; and
    coupling a plurality of bypass transistors to a plurality of diodes in the series of diodes for electrically bypassing the plurality of diodes, wherein the at least one bypass transistor is adapted for selective actuation to both an on state and an off state by a user while setting a substrate voltage bias level.

10. The method of claim 9 wherein coupling a plurality of bypass transistors to a plurality of diodes includes coupling a plurality of normally off bypass transistors to a plurality of diodes leaving the plurality of diodes unbypassed during normal operation and allowing the plurality of diodes to be selectively bypassed during testing operations.

11. The method of claim 9 wherein coupling a plurality of bypass transistors to a plurality of diodes includes coupling a plurality of normally on bypass transistors to a plurality of diodes leaving the plurality of diodes bypassed during normal operation and allowing the plurality of diodes to be selectively unbypassed during testing operations.

12. A method of forming an integrated circuit, comprising:

forming an array of memory cells on a substrate;
coupling a substrate voltage level controller circuit to the substrate for setting a substrate voltage bias level including:
coupling a series of diode connected transistors between a supply voltage source and the substrate; and
coupling at least one bypass transistor to at least one diode connected transistor in the series of diode connected transistors for electrically bypassing at least one diode connected transistor, wherein the at least one bypass transistor is adapted for selective actuation to both an on state and an off state by a user while setting a substrate voltage bias level.

13. The method of claim 12 wherein coupling at least one bypass transistor to at least one diode connected transistor includes coupling at least one bypass transistor to plurality of diode connected transistors for electrically bypassing the plurality of diode connected transistors.

14. The method of claim 12 wherein coupling at least one bypass transistor to at least one diode connected transistor includes coupling at least one normally off bypass transistor to at least one diode connected transistor leaving the at least one diode connected transistor unbypassed during normal operation and allowing the at least one diode connected transistor to be selectively bypassed during testing operations.

15. The method of claim 12 wherein coupling at least one bypass transistor to at least one diode connected transistor includes coupling at least one normally on bypass transistor to at least one diode connected transistor leaving the at least one diode connected transistor bypassed during normal operation and allowing the at least one diode connected transistor to be selectively unbypassed during testing operations.

16. A method of forming an integrated circuit, comprising:
forming an array of memory cells on a substrate;
coupling a substrate voltage level controller circuit to the substrate for setting a substrate voltage bias level including:
coupling a series of diode connected transistors between a supply voltage source and the substrate; and
coupling at least one bypass transistor to a plurality of diode connected transistors in the series of diode connected transistors for electrically bypassing the plurality of diode connected transistors, wherein the at least one bypass transistor is adapted for selective actuation to both an on state and an off state by a user while setting a substrate voltage bias level.

17. The method of claim 16 wherein coupling at least one bypass transistor to a plurality of diode connected transistors includes coupling a plurality of bypass transistors to a plurality of diode connected transistors in the series of diode connected transistors for electrically bypassing the plurality of diode connected transistors.

18. The method of claim 16 wherein coupling a plurality of bypass transistors to a plurality of diode connected transistors includes coupling a plurality of normally off bypass transistors to a plurality of diode connected transistors leaving the plurality of diode connected transistors unbypassed during normal operation and allowing the plurality of diode connected transistors to be selectively bypassed during testing operations.

19. The method of claim 16 wherein coupling a plurality of bypass transistors to a plurality of diode connected transistors includes coupling a plurality of normally on bypass transistors to a plurality of diode connected transistors leaving the plurality of diode connected transistors bypassed during normal operation and allowing the plurality of diode connected transistors to be selectively unbypassed during testing operations.

20. A method of forming an integrated circuit, comprising:
forming an array of memory cells on a substrate;
coupling a substrate voltage level controller circuit to the substrate for setting a substrate voltage bias level including:
coupling a series of diode connected transistors between a supply voltage source and the substrate; and
coupling a plurality of bypass transistors to a plurality of diode connected transistors in the series of diode connected transistors for electrically bypassing the plurality of diode connected transistors, wherein the at least one bypass transistor is adapted for selective actuation by a user to both an on state and an off state while setting a substrate voltage bias level.

21. The method of claim 20 wherein coupling a plurality of bypass transistors to a plurality of diode connected transistors includes coupling a plurality of normally off bypass transistors to a plurality of diode connected transistors leaving the plurality of diode connected transistors unbypassed during normal operation and allowing the plurality of diode connected transistors to be selectively bypassed during testing operations.

22. The method of claim 20 wherein coupling a plurality of bypass transistors to a plurality of diode connected transistors includes coupling a plurality of normally on bypass transistors to a plurality of diode connected transistors leaving the plurality of diode connected transistors bypassed during normal operation and allowing the plurality of diode connected transistors to be selectively unbypassed during testing operations.

23. A method of forming an integrated circuit, comprising:
forming an array of memory cells on a substrate;
coupling a substrate voltage level controller circuit to the substrate for setting a substrate voltage bias level including:
coupling a series of diodes between a supply voltage source and the substrate; and
coupling at least one bypass transistor to a plurality of diodes in the series of diodes for electrically bypassing a portion of the plurality of diodes, wherein the at least one bypass transistor is adapted for selective actuation to both an on state and an off state by a user while setting a substrate voltage bias level.

24. The method of claim 23 wherein coupling at least one bypass transistor to a plurality of diodes includes coupling at least one normally off bypass transistor to a plurality of diodes leaving the portion of the plurality of diodes unbypassed during normal operation and allowing the portion of the plurality of diodes to be selectively bypassed during testing operations.

25. The method of claim 23 wherein coupling at least one bypass transistor to a plurality of diodes includes coupling at least one normally on bypass transistor to a plurality of diodes leaving the portion of the plurality of diodes bypassed during normal operation and allowing the portion of the plurality of diodes to be selectively unbypassed during testing operations.

26. A method of forming an integrated circuit, comprising:

forming an array of memory cells on a substrate;

coupling a test circuit to the substrate, including:

coupling a series of resistive elements together in series to form a chain of elements having two terminals, the first terminal coupled to a supply voltage, and the second terminal coupled to the substrate; and coupling a plurality of switches to respective resistive elements in the series of resistive elements for electrically bypassing the respective resistive elements, wherein the plurality of switches are adapted for selective actuation to both an on state and an off state by a user.

27. The method of 26, wherein coupling a series of resistive elements together includes coupling a series of diodes together.

* * * * *

UNITED STATES PATENT AND TRADEMARK OFFICE
CERTIFICATE OF CORRECTION

PATENT NO. : 6,833,281 B2
DATED : December 21, 2004
INVENTOR(S) : Gilliam

It is certified that error appears in the above-identified patent and that said Letters Patent is hereby corrected as shown below:

Title page,
Item [57], ABSTRACT,
Line 7, after "end" insert -- of --.

Column 2,
Line 28, delete "M41" and insert -- M4, --, therefor.
Line 38, delete "a" and insert -- an --, therefor.

Column 4,
Line 39, delete "MB" and insert -- M8 --, therefor.
Line 55, delete "And" and insert -- and --, therefor.

Column 10,
Line 5, insert -- claim -- before "26".

Signed and Sealed this

Seventeenth Day of May, 2005

JON W. DUDAS
*Director of the United States Patent and Trademark Office*